United States Patent
Callison

[11] Patent Number: 5,933,044
[45] Date of Patent: Aug. 3, 1999

[54] MULTI-DIMENSIONAL IN-LINE LINEARIZATION PROM

[76] Inventor: R. Callison, 11410 E. Calle del Rincon, Tucson, Ariz. 85749-8853

[21] Appl. No.: 08/731,478

[22] Filed: Oct. 16, 1996

[51] Int. Cl.[6] ...................................................... G06G 7/12
[52] U.S. Cl. ............................ 327/362; 327/83; 327/138; 327/520
[58] Field of Search .................................... 327/362, 520, 327/138, 83

[56] References Cited

U.S. PATENT DOCUMENTS 4,253,335  3/1981  Shimomura .............................. 73/384

*Primary Examiner*—Margaret R. Wambach
*Attorney, Agent, or Firm*—David W. Collins; Andrew J. Rudd; Glenn H. Lenzen, Jr.

[57] ABSTRACT

A compensation circuit adapted to receive an input signal for a circuit element to be compensated. The input signal is used as an address to a memory at which a compensated signal is stored. The stored compensated signal is output to the circuit element as the compensated signal therefor. In a specific implementation, the command input is received by a shift register. The shift register converts a serial input to a parallel output. The parallel output of the shift register is combined with the output of a temperature sensor to provide an address for the memory. The command input data includes an address to the particular circuit element to be compensated. The temperature data is used to select a particular page of memory and the remainder of the command input data is used to select data from that page for output as the compensated signal for the selected element. In the illustrative embodiment, the components compensated are automatic gain control amplifiers.

17 Claims, 3 Drawing Sheets

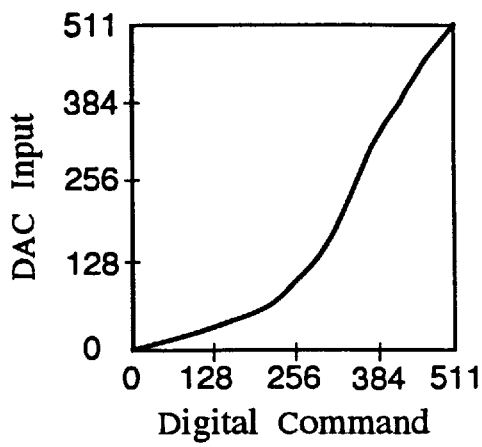
FIG. 4
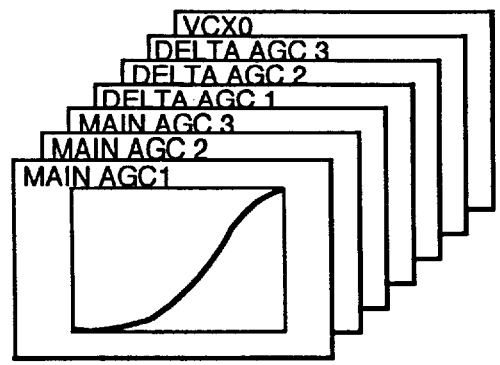
FIG. 5
FIG. 6
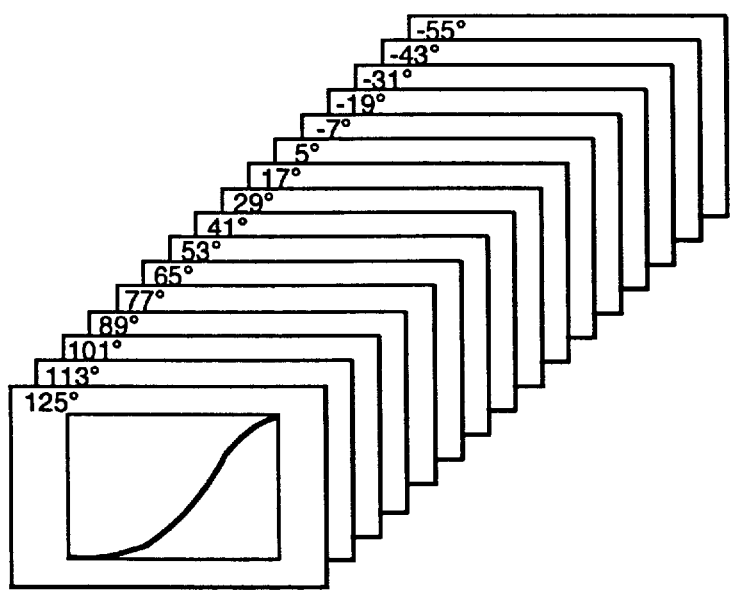
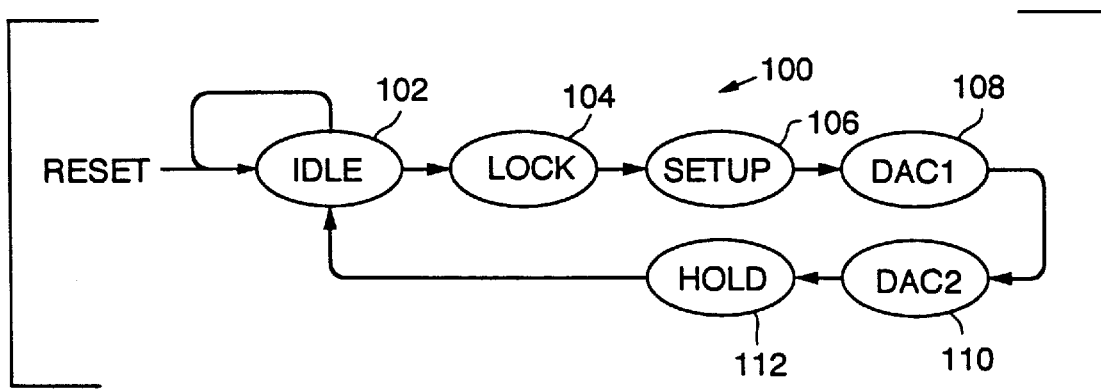
FIG. 7

MULTI-DIMENSIONAL IN-LINE LINEARIZATION PROM

BACKGROUND OF THE INVENTION

1. Field of the Invention

The present invention relates to electronic circuits and systems. More specifically, the present invention relates to circuits and systems for compensating for the response of an automatic gain control amplifier for temperature and other effects.

2. Description f the Related Art

Automatic gain control (AGC) amplifiers are amplifiers which provide an output signal within a predetermined range notwithstanding significant variations in an input signal. AGC amplifiers are used in a wide variety of applications including communications, signal processing and the like.

It is well known in the art that response of AGC amplifiers can change as function of temperature. In certain applications, this temperature sensitivity is highly undesirable. For example, in a missile guidance application, an executive computer in a radio frequency (RF) seeker system may issue a digital command to control attenuation of AGC amplifiers in an intermediate frequency (IF) stage of the receiver. The command is converted to an analog voltage to drive the AGC amplifiers. The nonlinear, temperature sensitive response of the AGC amplifiers introduces an error which can adversely affect the accuracy of the missile.

Accordingly, compensation of AGC amplifier response to temperature has long been a desired feature. Traditional approaches have been to: 1) add temperature compensating elements to the amplifier and 2) measure temperature and compensate for its effects in software using a lookup table or an algorithm. The first approach adds expense and complexity to the amplifier design. The second approach adds an additional burden to a system processor and limits its throughput. Neither approach is easily tailored for individual production units.

Hence, a need remains in the art for a system or technique for effecting compensation of a circuit without requiring expensive circuit modifications or processing time.

SUMMARY OF THE INVENTION

The need in the art is addressed by the compensation circuit of the present invention. The inventive compensation circuit is adapted to receive an input signal for a circuit element to be compensated. The input signal is used as an address to a memory at which a compensating signal is stored. The stored compensating signal is output to the circuit element as the compensated signal therefor.

In a specific implementation, the command input is received by a shift register. The shift register converts a serial input to a parallel output. The parallel output of the shift register is combined with the output of a temperature sensor to provide an address for the memory. The command input includes an address to the particular circuit element to be compensated. The temperature data is used to select a particular page of memory and the remainder of the command data is used to select data from that page for output as the compensated signal for the selected circuit element. In the illustrative embodiment, the circuit elements compensated are automatic gain control amplifiers. Timing is provided by a state machine in a conventional manner.

BRIEF DESCRIPTION OF THE DRAWINGS

FIG. 4 depicts a typical compensation curve stored in the memory of the compensation circuit of the present invention.

FIG. 5 illustrates pages of compensated data in the memory of the compensation circuit of the present invention for each device selected.

FIG. 6 illustrates pages of compensated data in the memory of the compensation circuit of the present invention for a given device at various temperatures.

FIG. 7 is a state diagram of the state machine of FIG. 1.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
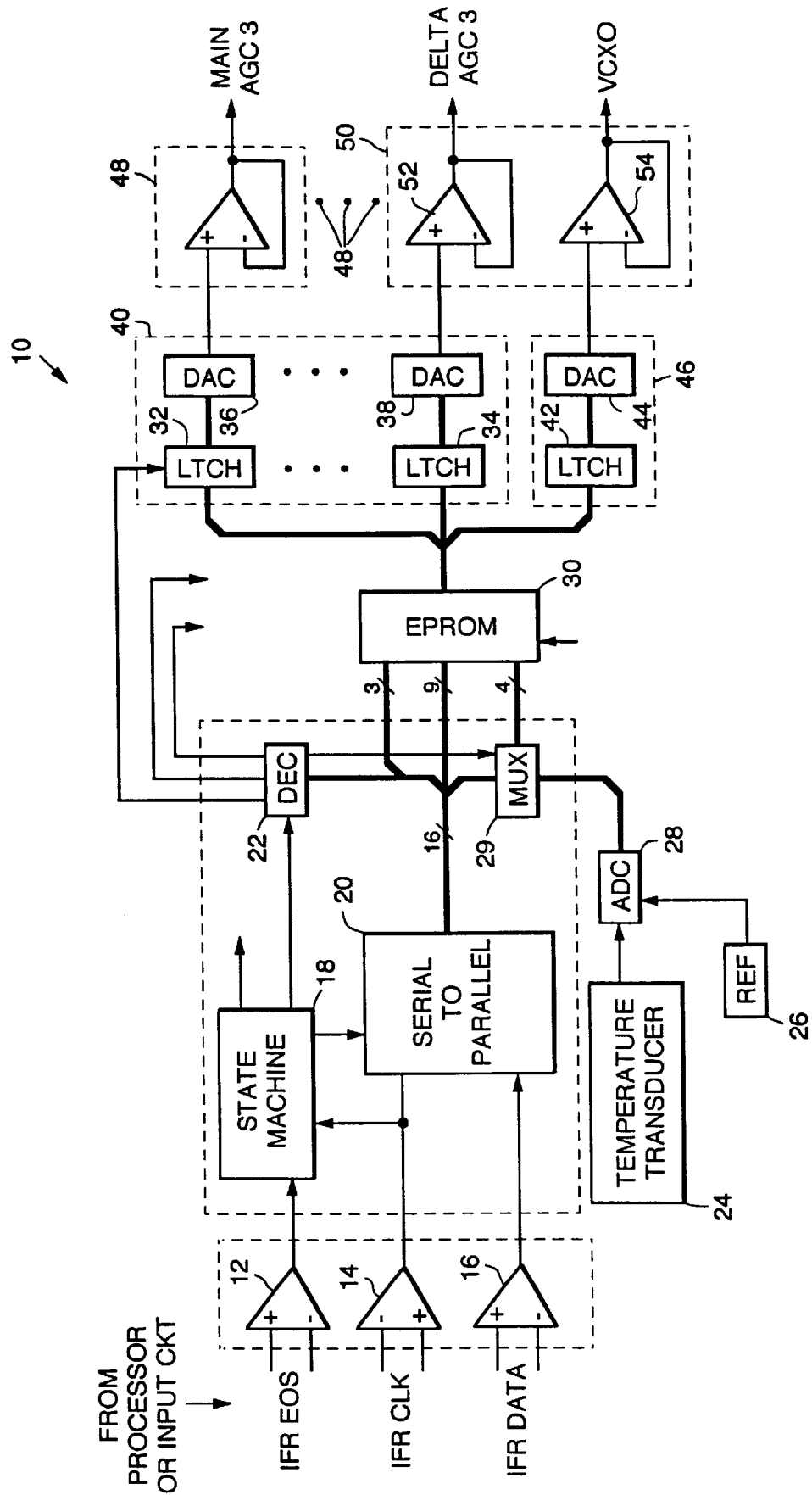
FIG. 1 is a block diagram of the compensation circuit of the present invention.

FIG. 1 is a block diagram of the compensation circuit of the present invention. The circuit 10 includes first, second and third buffer amplifiers 12, 14 and 16. The buffer amplifiers 12, 14 and 16 receive input digital data from a processor or input circuit (not shown). In FIG. 1, the first buffer amplifier 12 receives an end-of-shift signal denoted as 'IFR EOS'. (The EOS signal provides an indication that data currently on IFR Data is the last bit in the serial data stream. The second amplifier 14 receives a clock signal denoted as 'IFR CLK'. The third amplifier receives command data signal denoted as 'IFR DATA'.

The output from the first buffer amplifier 12 is input to a state machine 18. The state machine 18 provides timing signals for the system 10. The clock signals output by the second buffer amplifier 14 are input to a serial to parallel shift register 20 along with the data output of the third buffer amplifier 16.

One output of the shift register 20 is provided to an electrically erasable programmable read-only memory 30. The memory stores compensation curves for each device to be compensated. Automatic test equipment may be used to characterize each amplifier over temperature and command attenuation and program the memory accordingly. In the illustrative embodiment depicted in FIG. 1, three bits of the shift register output provide address data which is used to select one of several AGC amplifiers 48, 50 and 54 to receive each compensation signal as a voltage controlled crystal oscillator (VCXO) which requires no compensation. The three address bits are therefore input to the memory 30 and to an address decoder 22.

Nine bits of data output by the shift register 20 provide command data to the memory 30. The remaining four bits of data input to the memory 30 are provided by a temperature sensor transducer 24 via an analog-to-digital converter (ADC) 28 and a multiplexer 29 when an AGC amplifier is selected, or by the digital command via the multiplexer when the VCXO is selected. Therefore, the VCXO receives a 13-bit command from the executive processor (not shown). A second memory 26 provides a voltage reference to the ADC 28.

The output of the memory 30 is input to a digital-to-analog (DAC) circuit 40 which includes plural individual DACs 36 through 38 and 44 each of which is preceded by a latch 32, 34 and 42 respectively. Device selection is facilitated by the address decoder 22 via the latches 32, 34 and 42. The output of each DAC 36, 38 and 44 is provided to an associated AGC.

The buffer amplifiers are of conventional design and may be purchased from Advanced Micro Devices, Inc. as 26LS32 line receivers. The state machine 18, shift register 20, address decoder 22 and multiplexer 29 may be purchased from Altera (model #EPM5192). The memory 30 may be purchased from Advanced Micro Devices, Inc. (model #Am27C1024). The transducer 24, voltage reference memory 26 and ADC 28 may be purchased from Analog Devices (model nos. AD590, AD580 and AD670 respectively). The AGC DAC 40 may be purchased from Analog Devices (model no. DAC8412). The VCXO DAC 46 may be purchased from Analog Devices (model no. AD669). Each of the AGC amplifiers 48, 52 and 54 may be purchased from Analog Devices (model #822). Nonetheless, those skilled in the art will appreciate that these components are of conventional design and construction. Other components may be used without departing from the scope of the present invention.

Figure 2:
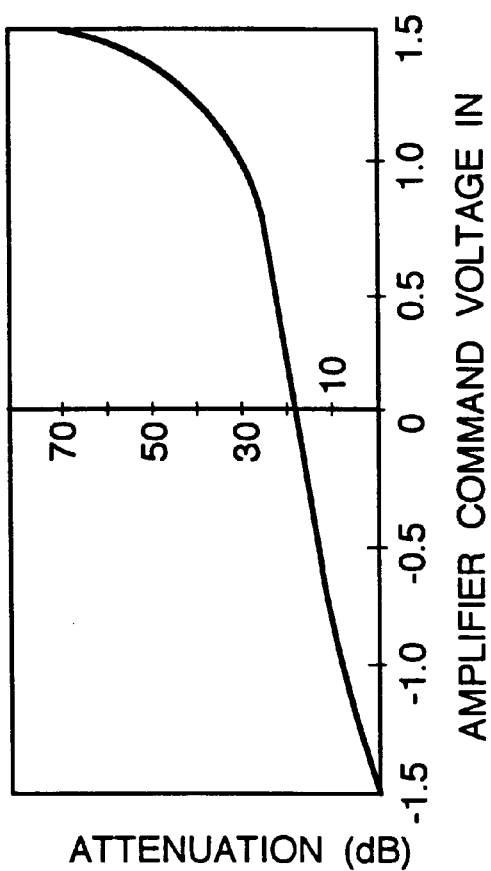
FIG. 2 is a graph of the voltage versus attenuation curve of a typical automatic gain control amplifier.

FIG. 2 is a graph of the voltage versus attenuation curve of a typical automatic gain control amplifier. In FIG. 2, the 'x' axis represents the AGC input control voltage and the 'y' axis represents the achieved attenuation. As is evident from FIG. 2, the typical response of an AGC amplifier is nonlinear. However, for many applications, a linear response is desired. Accordingly, a linearization PROM is typically placed at the input of each DAC. Unfortunately, over the operating range of the amplifier, temperature effects can introduce a considerable amount of error.

Figure 3:
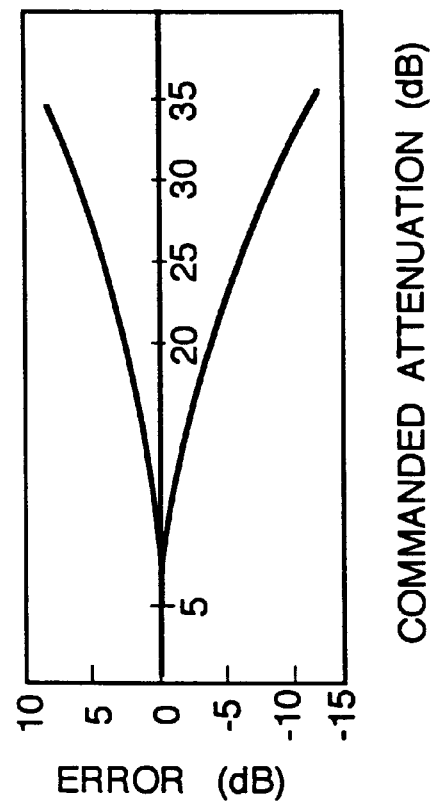
FIG. 3 depicts the temperature induced error as a function of commanded attenuation of a typical uncompensated AGC amplifier.

FIG. 3 depicts the temperature induced error as a function of commanded attenuation of a typical uncompensated AGC amplifier. As shown in FIG. 3, a −35 dB command will result in an achieved attenuation somewhere within a 20 dB range. Thus, compensation is required to maintain the desired linearity in the response of the AGC.

In accordance with the present teachings, compensation is achieved by adding a single linearization PROM (programmable read-only memory) 30 between the digital command and the DAC from which the amplifier attenuation command voltage is provided. The memory 30 is programmed to provide the inverse of the characteristic curve of each AGC amplifier. This is depicted in FIG. 4.

FIG. 4 depicts a typical compensation curve stored in the memory of the compensation circuit of the present invention. The memory 30 stores a curve designed to compensate for the known effects of temperature on a particular amplifier.

In operation, in the illustrative embodiment of FIG. 1, the 16 bits at the output of the shift register 20 are divided into three groups. Three bits are the address portion of the command message and determine to which amplifier the command applies. These three bits go to the most significant bits of the address bus 27 for the memory 30. These three address bits divide the memory 30 into 8 pages of linearization data for each device (of which only seven are used in the illustrative embodiment). The three bits also go to the address decoder 22 which causes data to be latched to the appropriate DAC as discussed above. This is depicted in FIG. 5. FIG. 5 illustrates pages of compensated data in the memory of the compensation circuit of the present invention for each device selected.

If one of the main, or delta, AGC amplifiers 48 is selected, (of which only one each is shown in FIG. 1), in the illustrative embodiment, nine bits of command data goes to the lower 9 address bits of the bus 27 for the memory 30. The remaining four bits of the memory address come from a digitized measure of temperature provided by the transducer 24 via the ADC 28 and the multiplexer 29. These four bits will further divide the memory 30 into 16 pages of linearization data for each of the main AGCs 48. Each of the 16 pages contains the linearization curve of a particular main AGC amplifier 48 at one of the 16 temperatures. In the illustrative embodiment, the curves are provided at 12 degree intervals from −55 to +125 degrees Centigrade as depicted in FIG. 6. FIG. 6 illustrates pages of compensated data in the memory of the compensation circuit of the present invention for a given device at various temperatures. That is, FIG. 6 depicts the sixteen pages of data corresponding to a single page of FIG. 5.

Thus, the input command signal is used to select a device and provide the command therefor. The memory provides a set of compensation curves for each device for each temperature.

FIG. 7 is a state diagram of the state machine 18 of FIG. 1. The state machine 18 enters the IDLE state at reset and waits for EOS 'high'. In the 'LOCK' state, the state machine 18 disables the shift register clock and enables memory output. In the 'SETUP' state, the machine 18 waits for data/address lines to settle. In the 'DAC1' and 'DAC2' states, the state machine 18 latches data to the DACs 36, 38 and 44. In the 'HOLD' state, the machine 18 maintains data while a write cycle ends. The state machine clock is provided by 'IFR CLK'.

Thus, the present invention has been described herein with reference to a particular embodiment for a particular application. In the illustrative embodiment, error may be reduced from 20 dB to 1 dB over the full temperature range utilizing the present teachings. Those having ordinary skill in the art and access to the present teachings will recognize additional modifications applications and embodiments within the scope thereof For example, although the invention is disclosed in three dimensions (command, device selection and temperature), the teachings provided herein are valid for more dimensions depending on memory density.

Further, although the invention is implemented for compensation of digital commands, analog signals may be compensated as well by first digitizing the signal, if necessary, then compensating the signal via a multi-dimensional memory as set forth herein.

It is therefore intended by the appended claims to cover any and all such applications, modifications and embodiments within the scope of the present invention.

Accordingly,

What is claimed is:

1. A compensation circuit comprising:
   first means for receiving an input signal for a circuit element;
   second means responsive to the input signal for providing a compensated signal, the second means including memory means for providing the compensated signal at an address provided by the input signal; and an automatic gain control amplifier responsive to the compensated signal for providing an output signal to the circuit element.

2. The invention of claim 1 wherein the memory means is a programmable read-only memory.

3. The invention of claim 1 including state machine means for providing timing for the system.

4. The invention of claim 1 wherein the second means further includes means for sensing a condition and providing a sensor output signal in response thereto.

5. The invention of claim 4 wherein the address includes the sensor output signal.

6. The invention of claim 5 wherein the means for sensing includes a sensor and a transducer.

7. The invention of claim 6 wherein the means for sensing further includes means for providing a reference signal and means for comparing the reference signal to a signal output by the transducer to provide the sensor output signal.

8. The invention of claim 7 wherein the transducer is a temperature sensor.

9. The invention of claim 1 further including means for converting the output of the memory means to an analog signal.

10. The invention of claim 9 further including latch means for storing the output of the memory means for input to the means for converting the output of the memory means to an analog signal.

11. The invention of claim 1 wherein the third means includes plural circuit components, each individually responsive to the compensated signal to provide the output signal.

12. The invention of claim 11 including means for selecting one of the components to receive the compensated signal.

13. The invention of claim 1 wherein the first means is a shift register.

14. The invention of claim 13 wherein the first means includes a serial to parallel. shift register.

15. A compensation circuit comprising a shift register for receiving an input signal for a circuit element;

means for sensing a condition and providing a sensed signal in response thereto;

a read-only memory for providing the compensated signal at an address provided by the input signal and the sensed signal; and means responsive to the compensated signal for providing an output signal to the circuit element.

16. The invention of claim 15 wherein the address includes an address to one of a plurality of circuit elements to be compensated.

17. A compensation method including the steps of:

receiving an input signal for an automatic gain control amplifier;

providing a compensated signal at a memory address provided by the input signal; and providing an output signal to the automatic gain control amplifier in response to the compensated signal.

* * * * *